(12) United States Patent
Pruitt

(10) Patent No.: US 6,703,692 B1
(45) Date of Patent: Mar. 9, 2004

(54) LEADFRAME WITH SUPPORT MEMBERS

(75) Inventor: David A. Pruitt, San Jose, CA (US)

(73) Assignee: Linear Technology Corp., Milpitas, CA (US)

( * ) Notice: Subject to any disclaimer, the term of this patent is extended or adjusted under 35 U.S.C. 154(b) by 0 days.

(21) Appl. No.: 10/066,030

(22) Filed: Jan. 31, 2002

(51) Int. Cl.$^7$ .............................................. H01L 23/495
(52) U.S. Cl. ..................... 257/666; 257/667; 257/670; 257/676; 257/787
(58) Field of Search ................................ 257/666, 667, 257/670, 676, 787

(56) References Cited

U.S. PATENT DOCUMENTS

| | | | |
|---|---|---|---|
| 5,252,783 A | 10/1993 | Baird | |
| 5,594,234 A | 1/1997 | Carter et al. | |
| 6,075,283 A | * 6/2000 | Kinsman et al. | ............. 257/666 |
| 6,194,777 B1 | * 2/2001 | Abbott et al. | ............... 257/666 |
| 6,246,110 B1 | * 6/2001 | Kinsman et al. | ............. 257/672 |
| 6,329,705 B1 | * 12/2001 | Ahmad | ........................ 257/666 |
| 6,331,448 B1 | * 12/2001 | Ahmad | ........................ 438/112 |
| 6,500,697 B2 | * 12/2002 | Ahmad | ........................ 438/112 |

* cited by examiner

Primary Examiner—David Nelms
Assistant Examiner—Andy Huynh
(74) Attorney, Agent, or Firm—Fish & Neave; Robert Morris; Andrew Van Court

(57) ABSTRACT

A leadframe is disclosed. The leadframe comprises a frame characterized by a substantially rectangular outline, a die paddle with a receiving surface, and a plurality of support members that connect the frame to the die paddle. The leadframe further comprises a plurality of leads connected to the frame, that will eventually serve to electrically connect an integrated circuit mounted on the die paddle to an external electrical device. The die paddle lies in a lower horizontal plane. A plurality of support members connect the frame with the die paddle. As projected on to a vertical plane that is perpendicular to the side of the frame to which a support member is attached, the offset angle between the support member and a vertical axis is less than 45 degrees.

45 Claims, 9 Drawing Sheets

LEADFRAME WITH SUPPORT MEMBERS

BACKGROUND OF THE INVENTION

This invention relates to integrated circuit (IC) packages. More particularly, this invention relates to leadframes and methods for manufacturing leadframes for use in IC packages.

In normal operation, IC dies produce heat which must be efficiently dissipated to prevent damage to the dies. Heat dissipation is a particularly acute problem for high power devices.

One common technique for effectively dissipating heat from an IC package involves placing a heat sink on top of the IC package, opposite to the side of the package that is mounted to a printed circuit board. Heat sinks, however, are generally large and are therefore not optimal or practical in many instances, such as in mobile electronic devices, where the size of the IC packages must be small to fit within the confines of the device (e.g., a cell phone).

One conventional small form factor package uses the printed circuit board upon which the package is mounted, in effect, as a heat spreader. According to this design, the bottom of a die paddle, upon which the die is mounted, is exposed so that it is in direct contact with the printed circuit board. This design effectively transfers heat to the printed circuit board.

FIG. 1 is a cross-sectional side view of a known IC package in which the die paddle (upon which the non-active side of a die is disposed) is configured to have a surface that forms a portion of one of the exterior surfaces of the package. In this manner, the exposed side of the die paddle may easily be placed in contact with another surface to dissipate heat from that is thermally transferred from the die.

As shown in FIG. 1, an IC die 10 is disposed on a die paddle 12, which is supported by a number of support members 18 connected to a frame 14. Die paddle 12, frame 14 and support members 18 together form a leadframe. A number of leads (not shown) extend from the package to provide the electrical connections from die 10 to external circuitry. The leads are electrically connected to the die by bond wires 13, which are individually connected from one of a number of bond pads (not shown) disposed on die 10 to the leads. Once all of the bond wires 13 have been connected, molding compound 16 surrounds die 10, die paddle 12 (except for the bottom exterior surface portion described above) and frame 14.

In the package shown in FIG. 1, the bottom of die paddle 12 is aligned on a plane that is parallel to, but lower than, the plane on which the leads of frame 14 are aligned. To support die paddle 12 in its lower position, support members 18 are connected between die paddle 12 and frame 14.

There are many known techniques for lowering die paddle 12 so that its upper surface is substantially parallel to frame 14. One of those techniques involves bending support members 18 down so that they form an angle between the upper and lower planes. This technique is illustrated in FIGS. 2A and 2B (and may, for example, result in a leadframe being formed similar to that shown in FIG. 1).

FIG. 2A is a cross-sectional side view of die paddle 12, frame 14 and support members 18 prior to the bending operation. Connection points 19 represent the place where die paddle 12 and support members 18 are connected together (and one of the locations at which bending will occur). As shown in FIG. 2A, die paddle 12 and support members 18 are initially co-planar (as is frame 14).

FIG. 2B is an overhead view of the leadframe assembly shown in FIG. 2A. In addition to die paddle 12 and support members 18, FIG. 2B also shows the configuration of frame 14, which surrounds die paddle 12 and support members 18. Moreover, FIG. 2B shows that, in this instance, there are four support members 18, each of which is curved to accommodate the bending operation as follows. To vertically offset die paddle 12 into the lower plane, die paddle 12 is gently pushed down, which causes support members 18 to bend and straighten out. If die paddle 12 is lowered a maximum distance, support members 18 will be substantially straight, as is illustrated by the leadframe shown in FIG. 1.

As illustrated in FIG. 1, the offset angle between one of the support members 18 and a vertical axis (as shown by the dashed line in FIG. 1), as projected on to a vertical plane may be, for example, forty-five degrees (45°) or more. The offset angle results in a lengthwise offset "L" (which is labeled "OFFSET" in FIG. 1) between die paddle 12 and frame 14. Large offset angles using known bending techniques often result in an OFFSET of five mils or more.

Large offset angles, which result in large OFFSETs, are generally undesirable because they necessarily decrease the allowable area for the die. In particular, a die paddle's length (and therefore the permissible area for the die) is limited because the ends of the die paddle are offset from the frame by a length of twice L.

In addition to limiting the die surface area, package configurations such as those shown in FIGS. 1, 2A and 2B also may tend to limit the possible numbers of electrical connections between a die and a leadframe. Specifically, referring again to FIG. 1, in known packages, a bond wire 13 runs from the die 10 and connects to one of the support members 18 adjacent to the die paddle 12, on the horizontal plane along which the die paddle 12 lies. The bond wire 13 typically serves as a low impedance ground connection between the die 10 and the frame 14. In other words, the frame 14 serves as a ground to the die 10. Although it is often desirable to have such a ground connection, the existence of the additional bond wire 13 increases the complexity of the package, which in turn makes the package harder to design. This difficulty is exacerbated by limiting the location of the connection between a die and a support member to the lower horizontal plane.

Therefore, it would be desirable to provide leadframes in which the permissible area for the die was increased in comparison with known techniques.

It would also be desirable to provide leadframes in which the offset between the die paddle and the frame were reduced.

It would be further desirable to provide leadframes that allow greater design flexibility with regard to the position of bond wires that serve to connect a die with a ground or a signal that is passed through the body of a leadframe.

SUMMARY OF THE INVENTION

In accordance with these and other objects of the present invention, novel lead frame geometries and methods of making the same are presented in which, for example, the permissible area for the die paddle is increased. The advantages of these geometries include, but are not limited to, decreasing the offset of a die paddle.

According to an embodiment of the present invention, a leadframe has a frame, a die paddle with a receiving surface, and a number of support members that connect the frame to the die paddle. As is described more fully below, the support members extend in a direction that is substantially parallel to the side of the die paddle to which they are attached, rather than being perpendicular to that surface. Because the support members extend in a direction that is mainly parallel to the side of the die paddle to which they are attached, as opposed to extending directly towards that side of the die paddle, the amount of room available to the die paddle is increased. Thus, a leadframe constructed in accordance with the present invention may be used with larger die paddles (and accordingly, larger dies), as compared to leadframes in which the support members extend substantially perpendicular to the side of the die paddle to which they are attached.

Moreover, the leadframe further has a number of leads connected to the frame that will eventually serve to electrically connect an integrated circuit (i.e., the die) mounted on the die paddle to an external electrical device.

The frame, which lies in an upper horizontal plane, generally has the shape of a rectangle that defines an interior portion. Along with the frame, the leads lie along the upper horizontal plane. Each of the leads has an outer end attached to the frame and an inner end within the interior portion.

The die paddle lies in a lower horizontal plane that is wholly within the confines of the exterior surfaces of the frame. A number of support members connect the frame with the die paddle. More particularly, each of the support members has a proximal end that is connected to the frame at a corresponding frame attachment point and a distal end connected to the die paddle at a corresponding die paddle attachment point, proximate to a corner of the die paddle. The frame has a number of extension members that extend from a side of the leadframe in a direction perpendicular to that side. Each of the proximal ends of the support members is attached to a corresponding one of these extension members.

Projected on to a first vertical plane that is perpendicular to the upper and lower horizontal planes and that is perpendicular to the side of the frame to which the corresponding support member is attached, is an offset angle between a support member and a vertical axis that is less than 45 degrees. According to the present invention, it is possible to make the offset angle 0 or even negative. By enabling the leadframe to have offset angles less than 45 degrees, leadframes constructed in accordance with the present invention may have die paddles that are larger than those in previously known leadframes, which in turn enables the leadframes to be used with larger dies. The present invention also provides other advantages, however, such as allowing electrical interconnections between a support member and a die, even in cases where the leadframe is designed with a relatively large offset angle.

Projected on to a second vertical plane that is parallel to the side of the frame to which a support member is attached, the support member extends at 45 degree angles ("spread angles") from the vertical axis.

In an alternate embodiment, a die paddle and frame are disposed along lower and upper horizontal planes as above, and each of a pair of support members is connected to a frame by a stem that has both horizontal and vertical offsets from the frame. Each of the support members is disposed relative to the stem in the same manner the support members are disposed relative to the frame in the originally described embodiment.

In yet another alternate embodiment, a bond wire connects a die directly to the body of a frame at some point on the upper horizontal plane. Direct die to frame connections typically serve to provide the die with a low impedance connection to ground. However, direct die to frame connections could serve other purposes. Allowing die to bond wire connections to be made on the upper horizontal plane increases design flexibility.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 2A is a cross-sectional side view of a conventional leadframe before its support members are bent. FIG. 2B is an overhead view showing the positioning of a die paddle supported by the leadframe shown in FIG. 2A.

DETAILED DESCRIPTION OF THE INVENTION

All references to "horizontal," "vertical," "upper," "lower" and the like are relative and do not imply any relationship to any absolute coordinate system. Thus, for example, "vertical" is not necessarily "up" or "down" with respect to the earth's surface.

A "support member" is any instrumentality or combination of instrumentalities that, alone or in conjunction with other instrumentalities, mechanically connects a frame with a die paddle. For example, in the case where a "stem" is connected to a frame on one side and a "support arm" on the other, and the support arm is in turn connected to a die paddle, the combination of the support arm and the stem is a support member. Also, the arm and stem individually are support members.

A support member with a distal or proximate end that is attached to an element means any portion of the support member that is attached to that element. For example, a support member may be attached to an entire side of a die paddle, in which case the distal end of the support member attached to the die paddle is any portion of the support member in contact with the die paddle.

Figure 3A:
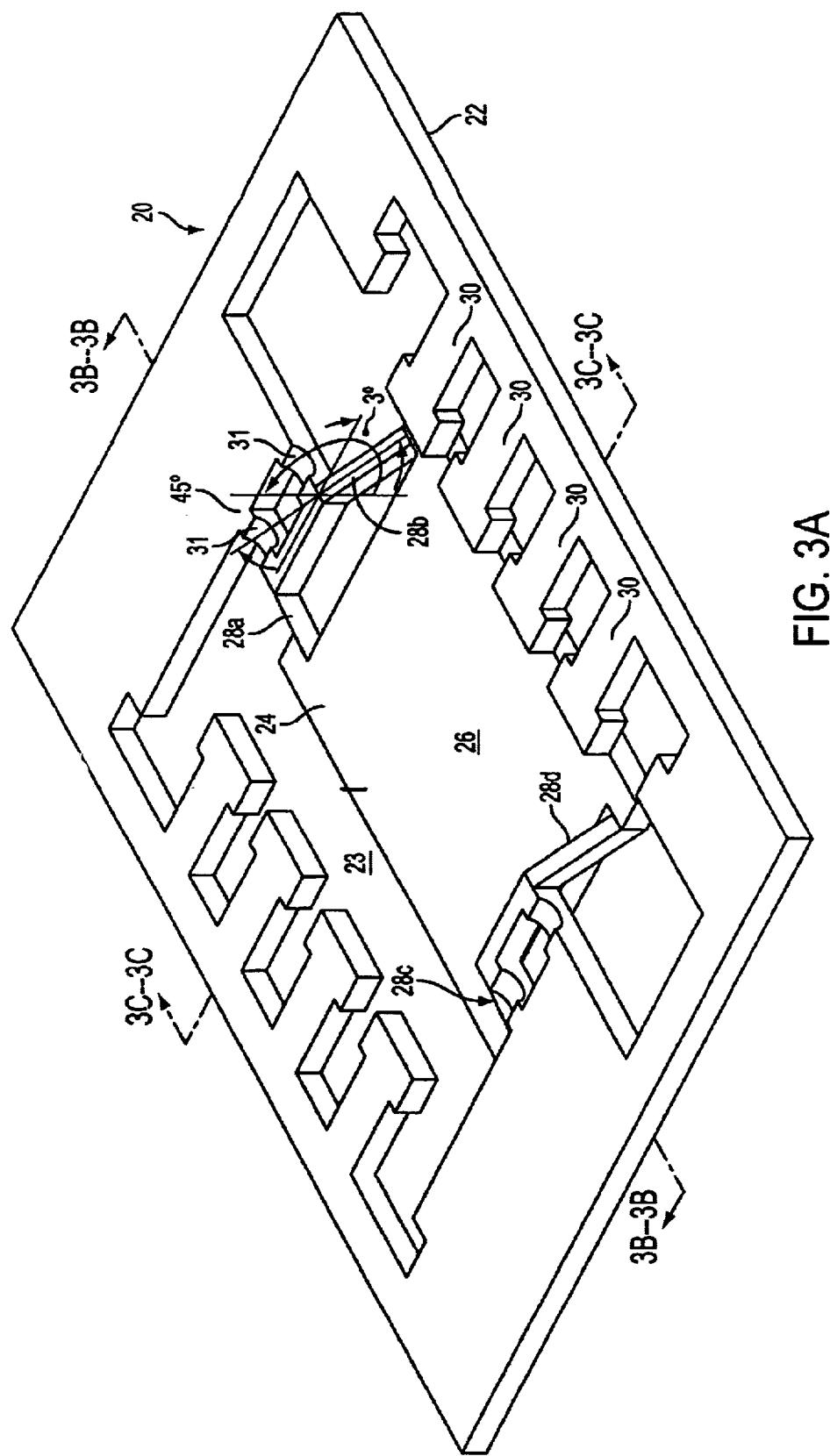
FIG. 3A is a perspective view of a leadframe constructed in accordance with the principles of the present invention.

FIG. 3A is a perspective view of a leadframe 20 constructed in accordance with the principles of the present invention. As shown, leadframe 20 has a frame 22 characterized by a substantially rectangular outline, a die paddle 24 with a receiving surface 26, and a number of support members 28a, 28b, 28c and 28d (sometimes collectively referred to in this specification as support members 28) that connect frame 22 to the die paddle 24. As is described more fully below, support members 28 are preferably oriented substantially parallel to the corresponding side of die paddle 24 to which they are attached, thereby increasing the room available for die paddle 24. Before describing the specific orientation of support members 28, some of the general features of the leadframe 20 are described.

Leadframe 20 has a number of leads 30 connected to frame 22 that eventually serve to electrically connect an integrated circuit mounted on die paddle 24 to an external electrical device.

Frame 22, which lies in an upper horizontal plane, generally has the shape of a rectangle that defines an interior portion 23. "Interior portion" includes not just points that lie on the upper horizontal plane, but all points within a vertical projection of the interior portion that lie within the upper horizontal plane. Thus, for example, at least a portion of die paddle 24 is in interior portion 23, even though die paddle 24 is located below the upper horizontal plane. Along with frame 22, leads 30 lie in the upper horizontal plane. Each of leads 30 has an outer end attached to frame 22 and an inner end within interior portion 23.

As mentioned above, die paddle 24 lies in a lower horizontal plane. Each of support members 28a, 28b, 28c and 28d connects frame 22 with die paddle 24. The pair of support members 28a and 28b on one side of frame 22 and the pair of support members 28c and 28d on the opposite side of frame 22 are preferably aligned with one another. More particularly, the pair of support members 28a and 28b on the one hand, and the pair of support members 28c and 28d on the other, are disposed symmetrically about a vertical plane of symmetry running through the center of the interior portion and parallel to each of these sides. (The term "vertical plane of symmetry" refers to the symmetrical placement of the support members 28. Frame 22, however, is not necessarily symmetrical about any plane or axis.)

Each of support members 28a, 28b, 28c and 28d extend in a direction that is substantially parallel to the side of die paddle 24 to which the particular support member (28a, 28b, 28c or 28d) is attached. Due to this orientation, the amount of room available to die paddle 24 is increased.

Figure 3B:
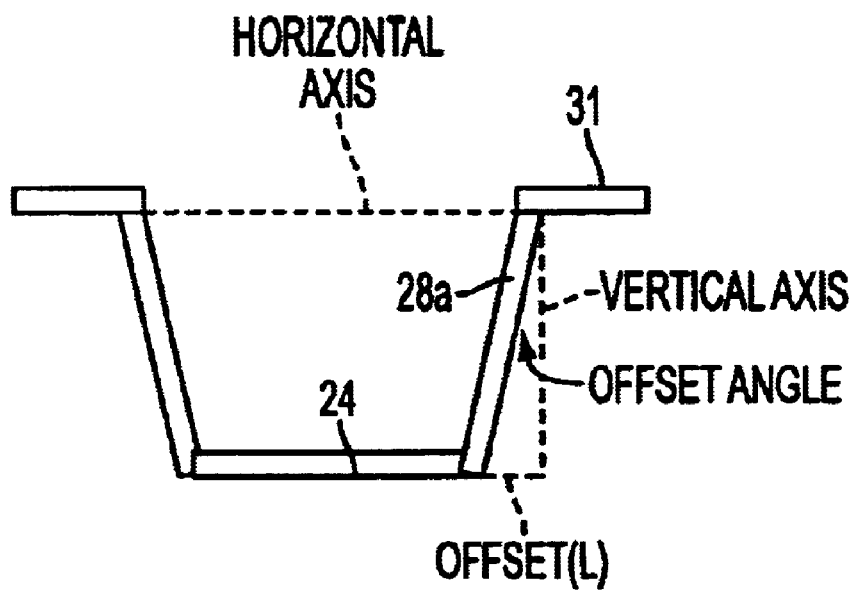
FIG. 3B is a vertical cross section of the leadframe shown in FIG. 3A taken from line 3B—3B of FIG. 3A.

The following more precisely defines the preferred orientation of support members 28. The side of frame 22 to which a particular one of the support members 28a, 28b, 28c or 28d is attached defines a horizontal axis that is perpendicular to that side. A vertical axis is perpendicular to the horizontal axis and runs through the upper and lower horizontal planes. As shown in FIG. 3B, which is a vertical cross section of leadframe 20 taken along line 3B—3B of FIG. 3A, the angle ("offset angle") between one of support members 28 (referring to any one of members 28a, 28b, 28c and/or 28d) and the vertical axis, projected onto a first vertical plane that is parallel to the horizontal axis, is approximately 3 degrees. It will be appreciated that the offset angle may have other values, which may even be negative (i.e., when one of support members 28 extends away from interior portion 23). For example, the angle may be 30, 20, 10, or 5 degrees or any other angle less than 45 degrees.

Figure 1:
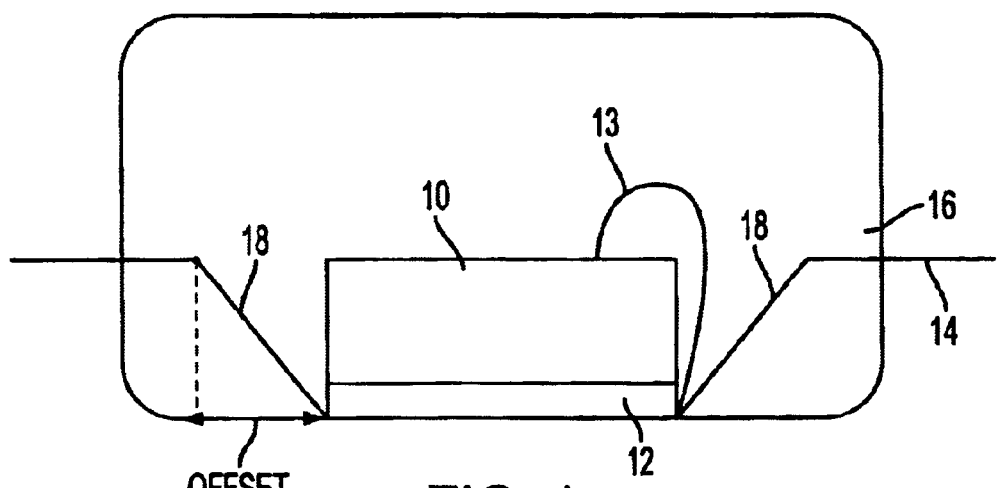
FIG. 1 is a cross-sectional view of a known leadframe based packaged IC die with a downset die paddle whose bottom side is exposed at the bottom of the package.
Figure 2A:
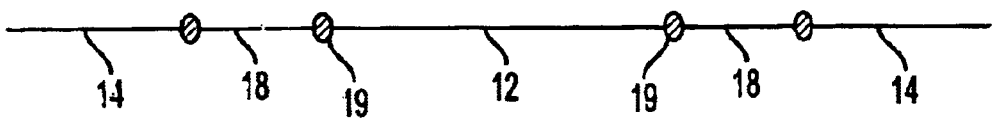
FIGS. 2A and 2B illustrate a known technique for bending leadframe support members to enable a die paddle to be downset.
Figure 2B:
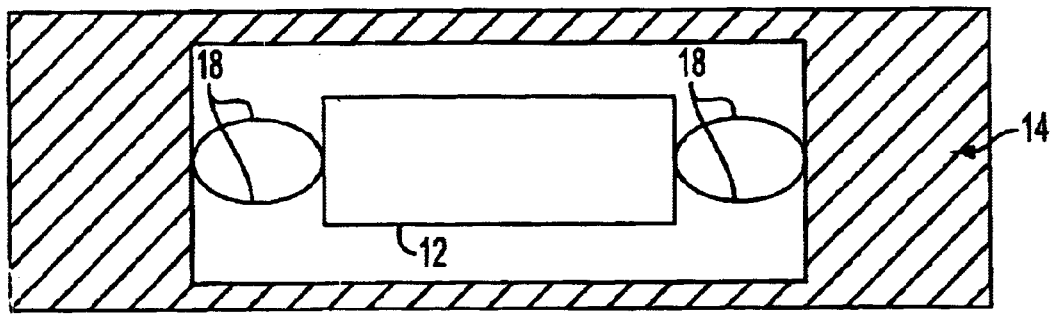

By enabling the offset angle to be less than 45 degrees, the present invention provides offsets between the die paddle and the leadframe which are reduced when compared to known leadframes, such as that shown in FIG. 1. This permits the use of larger die paddles (and, accordingly, larger dies) for a given sized leadframe. In one embodiment of the present invention, for example, where the offset angle was 3 degrees, the resulting offset L was approximately 1.3 mils (versus the approximate 5 mils previously described).

The offset angle may be less than 45 degrees because, as described above, each of support members 28 extends in a direction that is somewhat parallel to the side of die paddle 24 to which support. member 28a, 28b, 28c or 28d is attached.

Figure 3C:
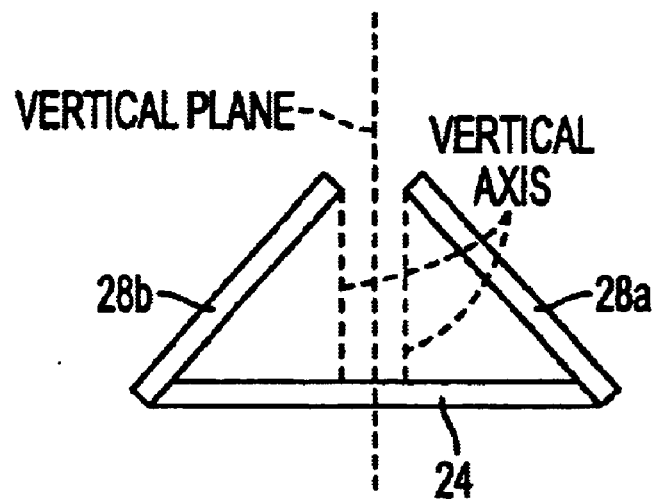
FIG. 3C is another vertical cross section of the leadframe shown in FIG. 3A taken along line 3C—3C of FIG. 3A.

Given this parallel type orientation, the extent of the downset of die paddle 24 is determined by the orientation of each of support members 28 in a second vertical plane parallel to the side of die paddle 24 to which it is attached. The orientation of support members 28 in this second vertical plane is illustrated in FIG. 3C, which is a vertical cross section of leadframe 20 taken along line 3C—3C of FIG. 3A. In other words, FIG. 3C is a view of support members 28 as seen from the second vertical plane. Projected onto the second vertical plane, each of the pair of support members 28 extends at a 45 degree angle ("spread angle") from the vertical axis. It will be appreciated that the spread angle may have values other than 45 degrees. Larger spread angles will result in smaller downsets.

The following more particularly describes the connections between support members 28 and frame 22, on the one hand, and die paddle 24, on the other. Each of support members 28 has a proximal end that is connected to frame 22 at a corresponding frame attachment point and a distal end connected to die paddle 24 at a corresponding die paddle attachment point, which is proximate to a corner of die paddle 24. Frame 22 has a number of extension members 31 that extend from a side of frame 22 in a direction perpendicular to that side. The extension members 31 are located somewhere between the corners formed from that side and adjacent sides. Each of the proximal ends of support members 28 is attached to a corresponding one of these extension members 31 at the corresponding frame attachment points.

With regard to FIG. 3C, it can be seen that the distal ends of a pair of support members 28 attached to one side of frame 22 extend away from a vertical plane that is perpendicular to the side of frame 22 and that passes between this pair of support members 28.

There are many possible variations of leadframe 20. For example, one or all of support members 28 may not be straight, in which case the pertinent offset angle is that between a line segment that connects the frame attach point of one of support members 28 to the corresponding die paddle attachment point.

According to yet another alternative embodiment, one or more of support members 28 may be attached to a die paddle at some point underneath the paddle, in which case the "distal end" of support member 28a, 28b, 28c or 28d may be considered the point where support member 28a, 28b, 28c or 28d first meets the lower horizontal plane.

In another embodiment, frame 22 may have a curved shape and one of support members 28 may be attached to frame 22 at a curved portion of frame 22, in which case, the horizontal axis is perpendicular to the tangent of a curve that defines frame 22 shape at the frame attach point.

In yet another embodiment, one of support members 28 may be attached to a corner of frame 22, in which case either of the sides forming the corner may be taken as the side to which the support member is attached.

Figure 4:
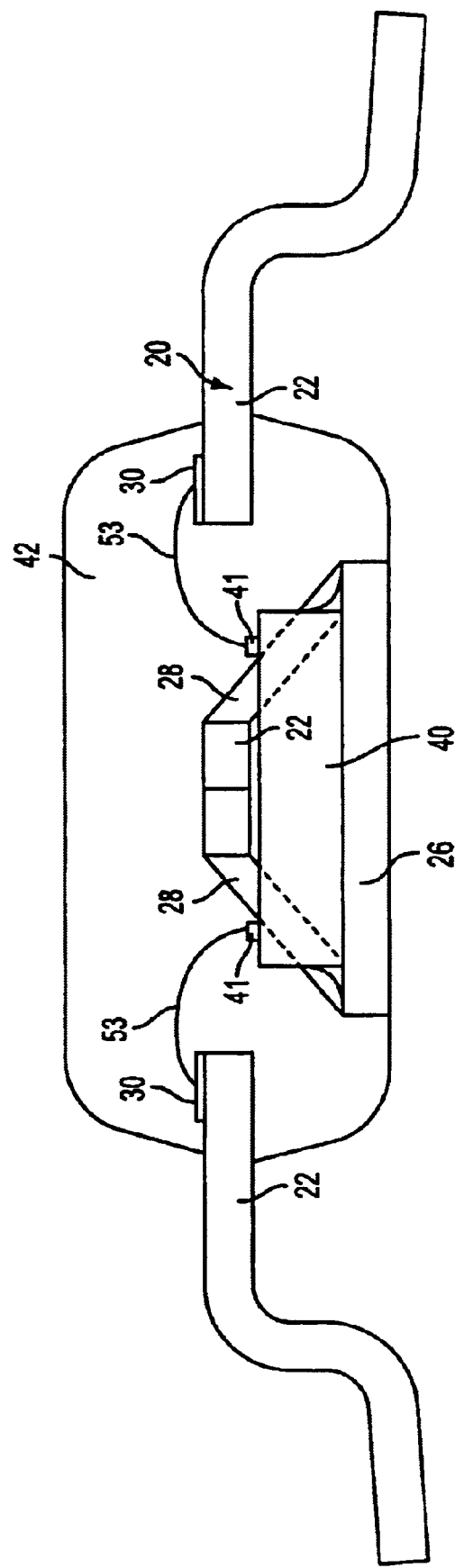
FIG. 4 is a cross-sectional side view of a possible assembled package that includes the leadframe shown in FIGS. 3A and 3B.

FIG. 4 is a cross-sectional side view of a possible assembled package that includes leadframe 20. As shown, a die 40 is mounted on die paddle 24. Because the leadframe 20 accommodates relatively larger die paddles for the reasons previously described, die 40 may be relatively larger than permitted by other types of leadframe designs.

Die 40 has a number of bond pads 41 on an active surface thereof. Each of a number of bond wires 53 connects one of bond pads 41 to a corresponding one of the number of leads 30. One pair of support members 28 is shown connecting frame 22 to die paddle 24. Molding compound 42 surrounds a portion of leadframe 20 and die 40, but is absent from the bottom of die paddle 24, which enables die paddle 24 to effectively conduct heat to whatever surface it is in contact with, typically a printed circuit board.

Figure 5:
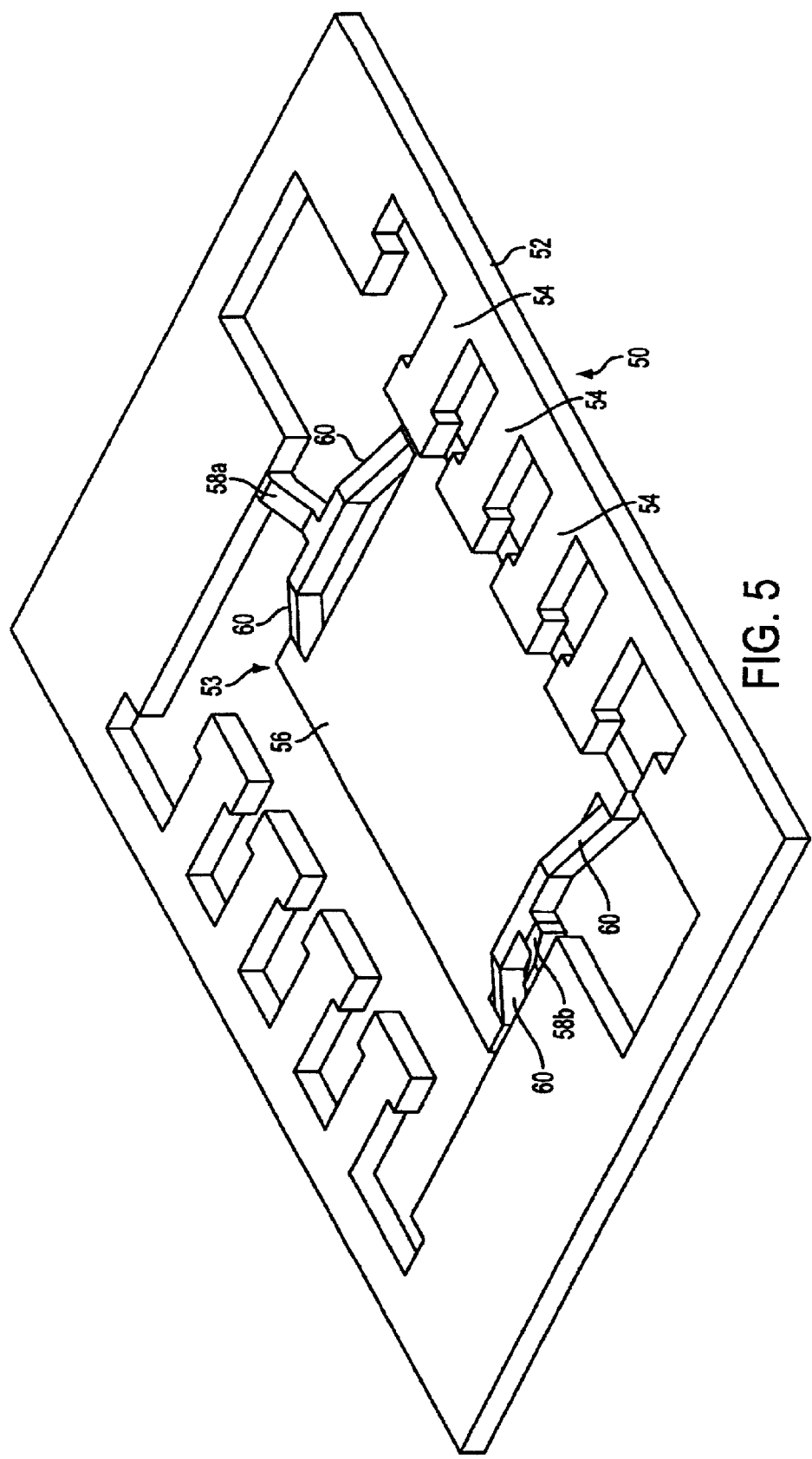
FIG. 5 is a perspective view of another embodiment of a leadframe constructed in accordance with the principles of the present invention.

FIG. 5 is a perspective view of another embodiment of a leadframe 50 constructed in accordance with the principles of the present invention. Leadframe 50 is similar to leadframe 20 except that it has a pair of stems 28a and 28b that connect a frame 52 to a plurality of support members 60.

Frame 52 defines an interior portion 53, a number of leads 54 and a die paddle 56 that are oriented in a substantially similar manner as the corresponding elements shown in FIG. 3A. The pair of stems 58a and 58b, each with proximal and distal ends, are connected at their proximal ends to opposite sides of frame 52. Each of a number of support members 60 has a proximal and distal end. Each of the proximal ends of a pair of the support members 60 is connected to the distal end of a corresponding stem 58a or 58b at a stem attachment point. The distal ends of support members 60 are connected to die paddle 56. The stems 58a and 58b extend in a vertical projection from an upper horizontal plane to a middle horizontal plane that is in between the upper horizontal plane and a lower horizontal plane. Stems 58a or 58b also extend along a horizontal axis perpendicular to the side to which it is attached, towards interior portion 53.

Each of support members 60 extends from the middle horizontal plane similar to the manner according to which support members 28 extend from the upper horizontal plane described above with reference to FIG. 3A. The offset angle, measured with respect to the stem attach point, is preferably approximately 3 degrees, although other values may be chosen.

Figure 6:
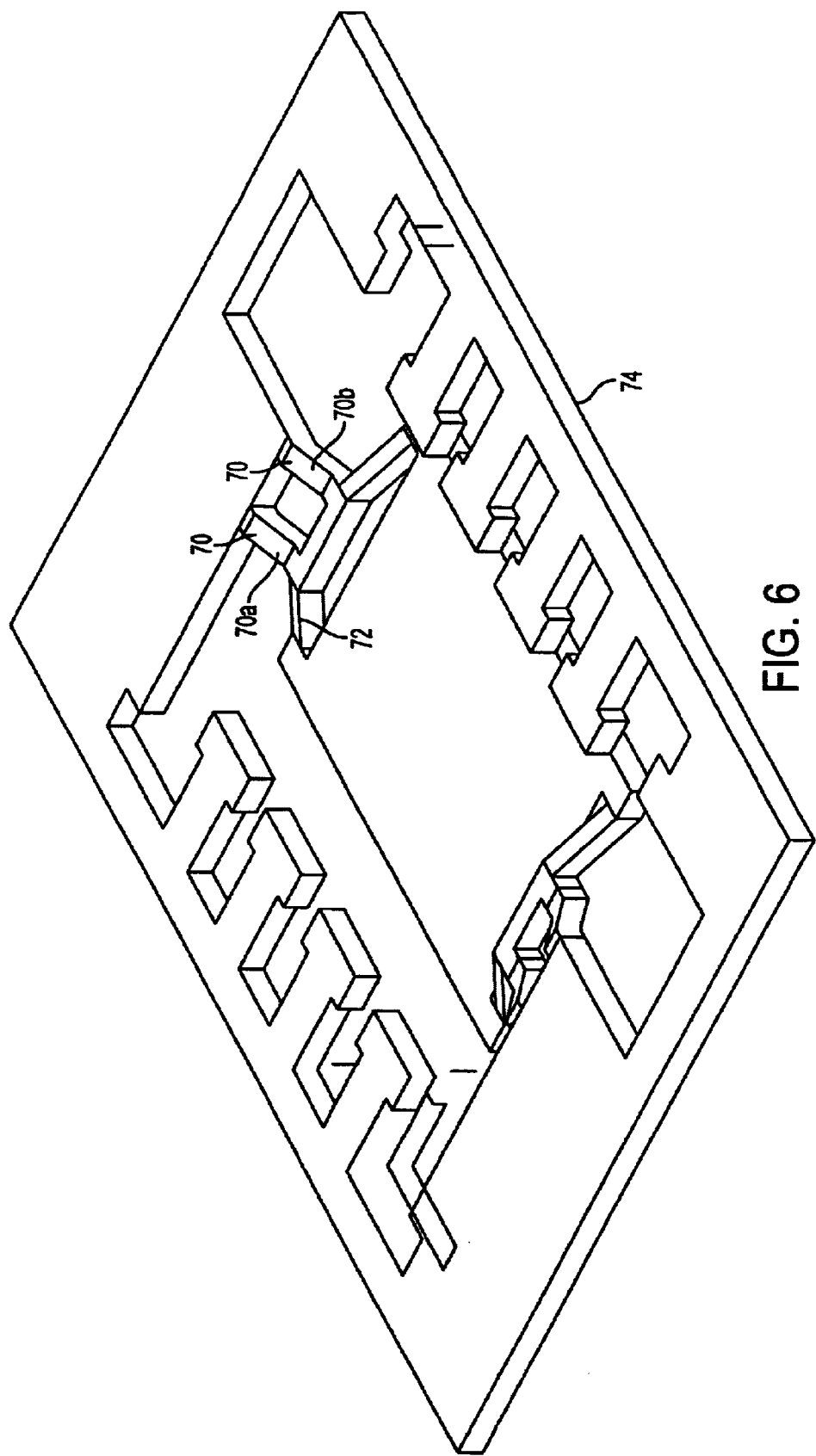
FIG. 6 is a perspective view of yet another embodiment of a leadframe constructed in accordance with the principles of the present invention.

FIG. 6 is another embodiment of the present invention, which is similar to that shown in FIG. 5, except that two stems 70a and 70b, instead of one, connect a pair of support members 72 to the side of a frame 74.

Figure 7:
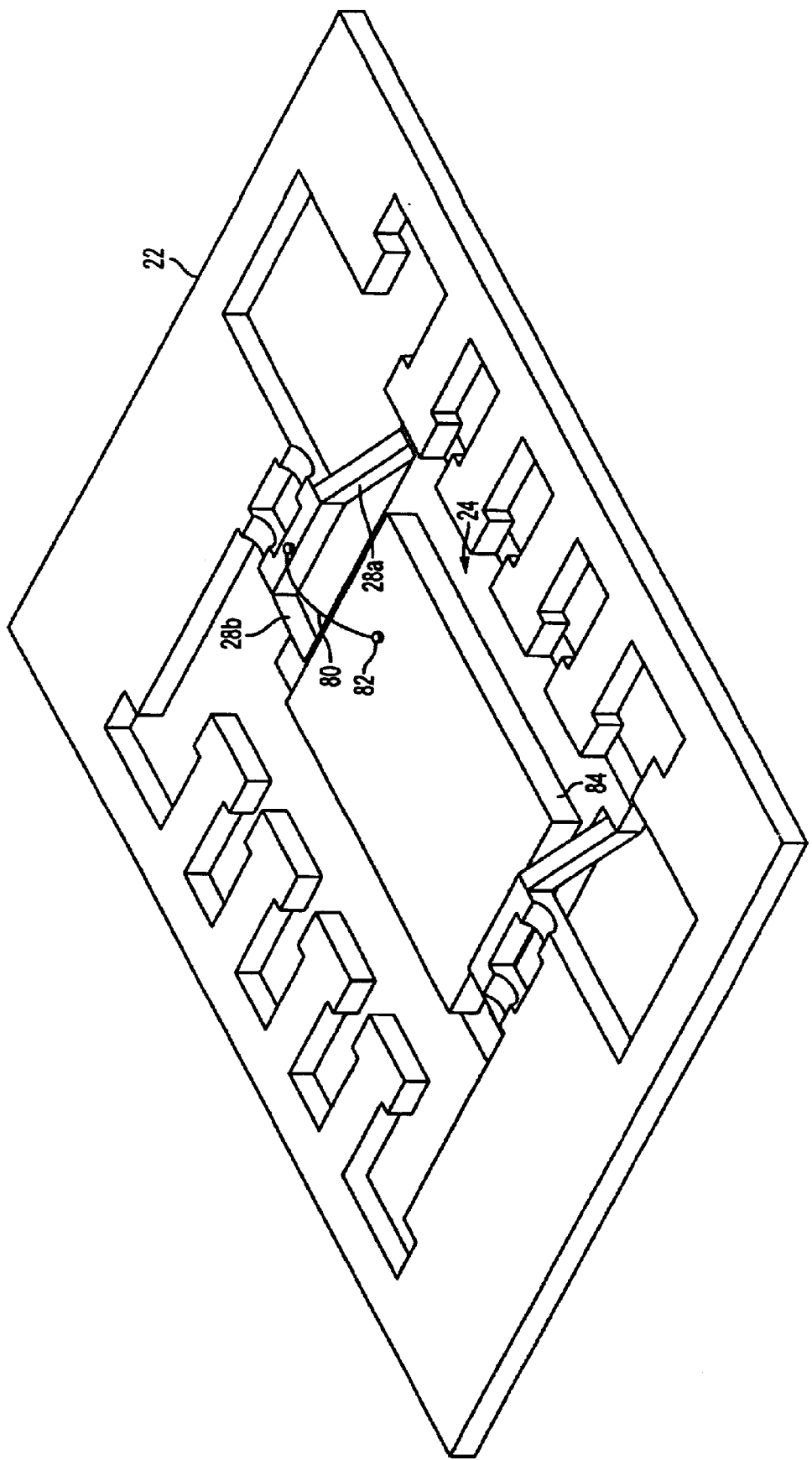
FIG. 7 is a perspective view of another embodiment of a leadframe constructed in accordance with the principles of the present invention wherein a support member is employed as a lead.

The present invention allows for flexible methods of electrically interconnecting a die with a leadframe. For example, the support members and/or the frame in the present invention may be used as leads, as is shown in FIG. 7. Numbers are identical to those described above with respect to FIG. 3A, except for the additional elements only shown in FIG. 7. As shown, a bond wire 80 connects a bond pad 82 on a die 84 to frame 22 at some point on the upper horizontal plane between support members 28a and 28b. In the embodiment shown in FIG. 7, die paddle 24 is conductive, so that the electrical connection between bond pad 82 and frame 22 establishes a common reference (e.g., power or ground) throughout die paddle 24, frame 22 and support members 28.

Figure 8A:
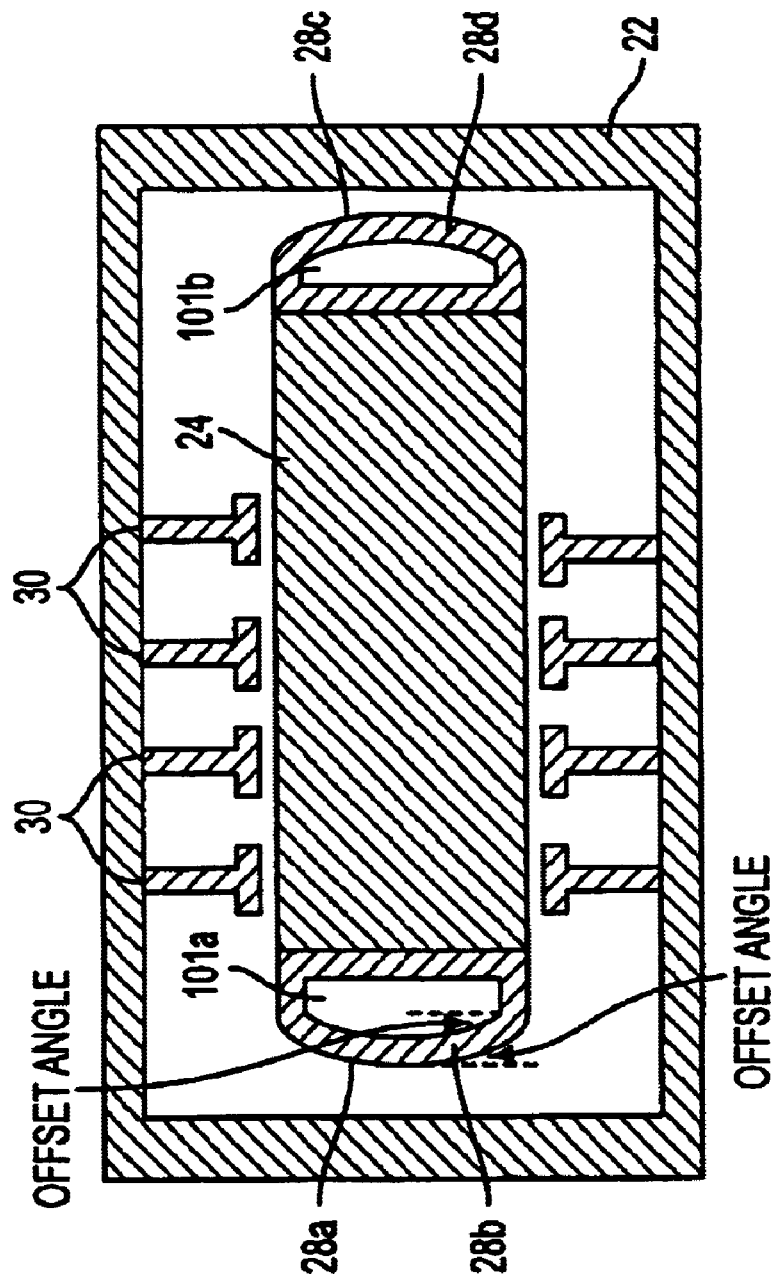
FIGS. 8A and 8B illustrate a preferred method for manufacturing a leadframe constructed in accordance with the principles of the present invention.
Figure 8B:
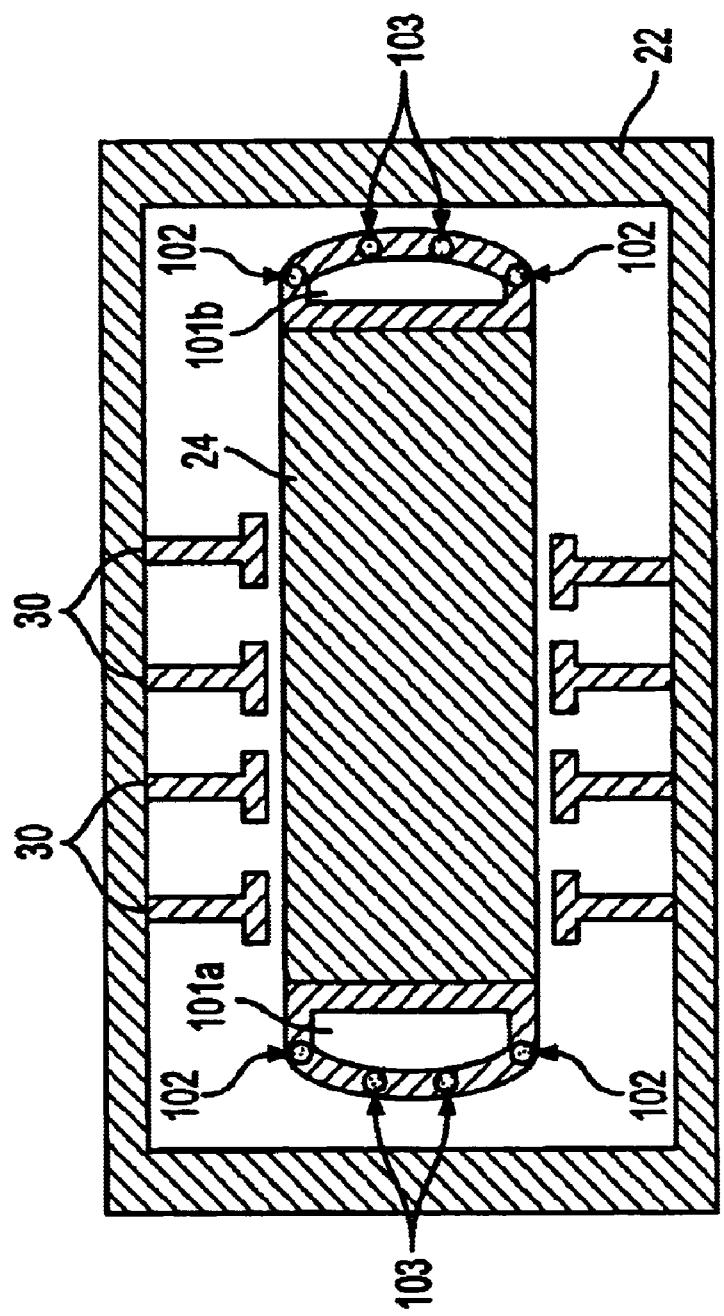

FIGS. 8A and 8B illustrate a preferred method for manufacturing a leadframe in accordance with the principles of the present invention. FIG. 8A shows a piece of metal 100 after it has been etched, thereby creating a pattern that defines the outline of frame 22, support members 28 and die paddle 24. Other methods, such as stamping, for shaping/forming the piece of metal 100 may be employed. The piece of metal 100 is two dimensional (planar) if the thickness of the metal 100 is ignored. The cross-hatched areas in FIG. 8A represent metal while the white areas represent the absence of metal.

As shown, support members 28 are defined by holes 101a and 101b towards the interior of the piece of metal 100 (i.e., the metal that will become die paddle 24) and by the absence of metal away from the interior. Support members 28 are angled, relative to an axis that is parallel to the side of frame 22 to which each one of the corresponding support members 28 is attached, at the desired offset angle (for example, approximately 3 degrees in the preferred embodiment).

As shown in FIG. 8B, a number of hammer/anvil combinations 102 push down die paddle 24 in a pure vertical direction, thereby moving die paddle 24 into the lower horizontal plane, resulting in leadframe 20 shown in FIG. 3A. Support members 28 are stretched during the hammering operation so that they are angled at approximately 45 degrees in the second vertical plane (see FIG. 3C). The 45 degree spread angle may be altered by changing the extent of the vertical travel during the hammering operation and/or by changing the size of holes 101a and 101b. A number of pliers 103 help to keep the upper portion of support members 28 in place during the hammering operation.

Thus, a novel leadframe has been disclosed. Although the leadframe has been shown in the context of particular types of packages, it will be appreciated that it may be employed in many other types of packages, including QFP's, and multi-chip modules.

Persons skilled in the art will thus appreciate that the present invention can be practiced by other than the described embodiments, which are presented for purposes of illustration and not of limitation, and that the present invention is limited only by the claims which follow.

What is claimed is:

1. A leadframe for use in a integrated circuit package, the leadframe comprising:

a frame lying in a first plane;

a plurality of leads disposed substantially in the first plane, each of said leads having an end attached to the frame;

a die paddle lying in a second plane which is substantially parallel to the first plane and is offset from the first plane by a given distance;

first and second support members that are connected between one end of the die paddle and the frame, the first and second support members being in the same plane as each other and being substantially parallel to the end of the die paddle to which they are connected; and third and fourth support members that are connected between the other end of the die paddle and the frame, the third and fourth support members being in the same plane as each other and being substantially parallel to the end of the die paddle to which they are connected.

2. The leadframe of claim 1, wherein an offset angle is formed between the plane of the first and second support members and a line that is perpendicular to the first plane where the first member is connected to the die paddle, the offset angle being less than 45 degrees.

3. The leadframe of claim 2, wherein the offset angle is less than 30 degrees.

4. The leadframe of claim 2, wherein the offset angle is less than 20 degrees.

5. The leadframe of claim 2, wherein the offset angle is less than 10 degrees.

6. The leadframe of claim 2, wherein the offset angle is less than 5 degrees.

7. The leadframe of claim 2, wherein the offset angle is less than 0 degrees.

8. The leadframe of claim 1, further comprising:
an integrated circuit die;
at least one bond pad mounted to said die; and
a bond wire mounted between said bond pad and the frame.

9. A leadframe for an integrated circuit, comprising:
a frame having a plurality of sides defining an interior portion of the frame, at least a portion of the frame lying in an upper horizontal plane, the horizontal plane defining a vertical axis perpendicular thereto;
a plurality of leads, each of the plurality of leads having an outer end attached to the frame and an inner end within the interior portion, at least one of the plurality of leads disposed substantially along the upper horizontal plane;
a die paddle, at least a portion of the die paddle lying in a lower horizontal plane within the interior portion;
a first support member connecting the frame to the die paddle, the first support member having a proximal end and a distal end defining a first line segment therebetween, wherein the proximal end is connected to the frame on a first side thereof at a first frame attach point, wherein the distal end is connected to the die paddle at a first die paddle attach point, the first side of the frame defining a horizontal axis perpendicular thereto; wherein
an offset angle between the first line segment and the vertical axis, projected onto a first vertical plane that is parallel to the horizontal axis, is less than 45 degrees, wherein a positive offset angle corresponds to extension of the distal end of the first support member toward the interior portion.

10. The leadframe of claim 9 wherein the offset angle is less than 30 degrees.

11. The leadframe of claim 9 wherein the offset angle is less than 20 degrees.

12. The leadframe of claim 9 wherein the offset angle is less than 10 degrees.

13. The leadframe of claim 9 wherein the offset angle is less than 5 degrees.

14. The leadframe of claim 9 wherein the offset angle is less than 0 degrees, such that the distal end of the first support member, projected on the first vertical plane, extends away from the interior portion.

15. The leadframe of claim 9 wherein the first support member, projected on to a second vertical plane that is perpendicular to the first vertical plane, extends at a 45 degree angle from the vertical axis.

16. The leadframe of claim 15 wherein the distal end of the first support member extends away from the center of the interior portion in a projection on the second vertical plane.

17. The leadframe of claim 9 wherein the frame has a substantially rectangular shape.

18. The leadframe of claim 9 wherein the distal end of the first support member is connected to the die paddle proximate to a corner thereof.

19. The leadframe of claim 9 further comprising a second support member connected to the frame at a second frame attach point on the first side of the frame and connected to the die paddle at a second die paddle attach point opposite the first die paddle attach point, wherein the second support member, projected on to the second vertical plane, extends at a 45 degree angle from the vertical axis.

20. The leadframe of claim 9 further comprising a second support member connected to the frame at a second frame attach point on the side of the frame opposite the side on which the first frame attach point is located, and connected to the die paddle at a second die paddle attach point on the side of the die paddle opposite the side on which the first die paddle attach point is located, the second support member thereby connecting the frame to the die paddle.

21. The leadframe of claim 20 wherein the second support member has substantially the same shape as the first support member.

22. The leadframe of claim 19 further comprising third and fourth support members connected to the frame on the side of the frame opposite the side on which the first and second frame attach points are located, wherein the third and fourth support members are each connected to the die paddle proximate to corresponding corners thereof, and wherein the pair of first and second support members and the pair of third and fourth support members are disposed symmetrically about a vertical plane of symmetry running through the center of the interior portion and perpendicular to the first vertical plane.

23. The leadframe of claim 9 wherein each of the plurality of leads lies along the upper horizontal plane for substantially the entire length of the lead.

24. The leadframe of claim 9 wherein substantially all of the frame lies on the upper horizontal plane and substantially all of the die paddle lies on the lower horizontal plane.

25. A leadframe for an integrated circuit, comprising:
a frame defining an interior portion thereof, at least a portion of the frame lying in an upper horizontal plane, the horizontal plane defining a vertical axis perpendicular thereto;
a plurality of leads, each of the plurality of leads having an outer end attached to the frame and an inner end within the interior portion;
a die paddle, at least a portion of the die paddle lying in a lower horizontal plane within the interior portion;
a first stem having a proximal end connected to a first side of the frame and a distal end lying in a middle horizontal plane between the upper and lower horizontal planes, the first side of the frame defining a horizontal axis perpendicular thereto;
a first support member connecting the first stem to the die paddle, the first support member having a proximal end and a distal end defining a first line segment therebetween, wherein the proximal end is connected to the first stem at a first stem attach point, wherein the distal end is connected to the die paddle at a first die paddle attach point; wherein
an offset angle between the first line segment and the vertical axis, projected onto a first vertical plane that is parallel to the horizontal axis, is less than 45 degrees, wherein a positive offset angle corresponds to extension of the distal end of the first support member toward the interior portion.

26. The leadframe of claim 25 wherein the offset angle is less than 30 degrees.

27. The leadframe of claim 25 wherein the offset angle is less than 20 degrees.

28. The leadframe of claim 25 wherein the offset angle is less than 10 degrees.

29. The leadframe of claim 25 wherein the offset angle is less than 5 degrees.

30. The leadframe of claim 25 wherein the offset angle is less than 0 degrees, such that the distal end of the first support member, projected on the first vertical plane, extends away from the interior portion.

31. The leadframe of claim 25 wherein the first support member, projected on to a second vertical plane that is perpendicular to the first vertical plane, extends at a 45 degree angle from the vertical axis.

32. The leadframe of claim 25 wherein the distal end of the first support member extends away from the center of the interior portion in a projection on the second vertical plane.

33. The leadframe of claim 25 wherein the frame has a substantially rectangular shape.

34. The leadframe of claim 25 wherein the distal end of the first support member is connected to the die paddle proximate to a corner thereof.

35. The leadframe of claim 25 further comprising a second support member connected to the first stem at a second stem attach point and connected to the die paddle at a second die paddle attach point opposite the first die paddle attach point, wherein the second support member, projected on to the second vertical plane, extends at a 45 degree angle from the vertical axis.

36. The leadframe of claim 25 further comprising:
a second stem with a proximate end and a distal end, wherein the proximate end of the second stem is connected to the frame on the side opposite of the side to which the first stem is attached, wherein the second stem and the first stem are disposed symmetrically about a vertical plane of symmetry running through the center of the interior portion and perpendicular to the horizontal axis;
third and fourth support members connected to the distal end of the second stem, wherein the third and fourth support members are each connected to the die paddle proximate to corresponding corners thereof, and wherein the pair of first and second support members and the pair of third and fourth support members are disposed symmetrically about the vertical plane of symmetry.

37. The leadframe of claim 25 wherein each of the plurality of leads lies along the upper horizontal plane for substantially the entire length of the lead.

38. The leadframe of claim 25 wherein substantially all of the frame lies on the upper horizontal plane and substantially all of the die paddle lies on the lower horizontal plane.

39. An integrated circuit package assembly comprising:
a leadframe comprising:
a frame defining an interior portion thereof, at least a portion of the frame lying in an upper horizontal plane;
a plurality of leads, each of the plurality of leads having an outer end attached to the frame and an inner end within the interior portion, at least one of the plurality of leads disposed substantially along the upper horizontal plane;
a die paddle, at least a portion of the die paddle lying in a lower horizontal plane within the interior portion;
a first support member extending from a first side of the frame and connecting the frame to the die paddle, the first side defining a horizontal axis perpendicular thereto;
an integrated circuit die disposed on the die paddle, the die having a plurality of bond pads on an active face thereof;
a plurality of bond wires, each of the plurality of bond wires connecting a corresponding one of the plurality of bond pads to a corresponding one of the plurality of leads; wherein
an offset between the die and the frame, as projected on to the horizontal axis, is less than 4 mils.

40. The semiconductor package assembly of claim 39 wherein the offset between the die and the frame, as projected on to the horizontal axis, is less than 3 mils.

41. The semiconductor package assembly of claim 39 wherein the offset between the die and the frame, as projected on to the horizontal axis, is less than 2 mils.

42. The semiconductor package assembly of claim 39 further comprising molding compound surrounding at least a portion of the leadframe and a portion of the die, wherein at least a portion of the face of the die paddle opposed to the face on which the die is mounted is not covered by the molding compound.

43. An integrated circuit package comprising:
a frame having a plurality of sides defining an interior portion of the frame, at least a portion of the frame lying in an upper horizontal plane;
a plurality of leads, each of the plurality of leads having an outer end attached to the frame and an inner end within the interior portion, at least one of the plurality of leads disposed substantially along the upper horizontal plane;
a die paddle, at least a portion of the die paddle lying in a lower horizontal plane within the interior portion;
an integrated circuit die disposed on the die paddle, the die having a plurality of bond pads on an active face thereof;
a first support member connecting the frame to the die paddle, the first support member having a proximal end and a distal end, wherein the proximal end is connected to the frame on a first side thereof at a first frame attach point, wherein the distal end is connected to the die paddle at a first die paddle attach point, wherein the first support member, projected onto a horizontal plane, is substantially parallel to the first side of the die paddle; and
a bond wire electrically connecting one of the bond pads on the die to the frame, wherein one end of the bond wire is attached to the frame at some point on the upper horizontal plane.

44. The semiconductor package assembly of claim 43 wherein another end of the bond wire is attached to the die, thereby forming a direct electrical connection between the die and the frame.

45. A leadframe for an integrated circuit, comprising:
a frame having a plurality of sides defining an interior portion of the frame, at least a portion of the frame lying in an upper horizontal plane;

a plurality of leads, each of the plurality of leads having an outer end attached to the frame and an inner end within the interior portion;

a die paddle, at least a portion of the die paddle lying in a lower horizontal plane within the interior portion;

a pair of support members connecting the frame to the die paddle, each of the pair of support members having a proximal end and a distal end, wherein the proximal end is connected to the frame on a first side thereof at a corresponding pair of frame attach points and wherein the distal end is connected to the die paddle at a corresponding die paddle attach point; wherein the distal ends of the pair of support members extend away from a vertical plane that is perpendicular to the first side of the frame and that passes between the pair of support members.

* * * * *